United States Patent [19]
Noé et al.

[11] Patent Number: 5,629,864
[45] Date of Patent: May 13, 1997

[54] TESTING PROCESS FOR THE QUALITY CONTROL OF ELECTROMAGNETICALLY ACTUATED SWITCHING DEVICES

[75] Inventors: Ernst-Ludwig Noé, Heroldsbach; Peter Schwarz, Erlangen, both of Germany

[73] Assignee: Siemens Aktiengesellschaft, Munich, Germany

[21] Appl. No.: 335,877

[22] PCT Filed: May 18, 1993

[86] PCT No.: PCT/DE93/00433

§ 371 Date: Nov. 22, 1994

§ 102(e) Date: Nov. 22, 1994

[87] PCT Pub. No.: WO93/24845

PCT Pub. Date: Dec. 9, 1993

[30]  Foreign Application Priority Data

May 22, 1992 [DE] Germany ............................ 42 17 065.6
May 22, 1992 [DE] Germany ............................ 42 17 067.2
May 22, 1992 [DE] Germany ............................ 42 17 105.9

[51] Int. Cl.⁶ .................................................. G01R 31/327
[52] U.S. Cl. .................................................. 364/506; 324/420
[58] Field of Search ............................... 364/506, 508; 73/584, 570, 587, 609, 632, 649, 658, 659; 324/415, 418, 420, 421, 422, 423, 424, 513; 340/683; 381/56

[56]  References Cited

U.S. PATENT DOCUMENTS

| | | |
|---|---|---|
| 3,560,844 | 2/1971 | Brown . |
| 4,429,578 | 2/1984 | Darrel et al. .............................. 73/659 |
| 5,419,197 | 5/1995 | Ogi et al. .................................. 73/659 |

FOREIGN PATENT DOCUMENTS 1247-963-A  6/1984  U.S.S.R. .
1272374    12/1984  U.S.S.R. .

OTHER PUBLICATIONS

Soviet Patents Abstracts, Section EI, Week J51, 9. Feb. 1983, Derwent Publicaitons Ltd., London, GB; Class V, & SU,907 623 (Zaretskas) 28. Feb. 1982.
Soviet Patents Abstracts, Section EI, Week 8712, 1. Apr. 1987, Derwent Publications Ltd., London, GB; Class T, AN 87–085625, & SU,A,1 247 963 (OMSK Railway).
Soviet Patents Abstracts, Section EI, Week K41, 23. Nov. 1983, Derwent Publications Ltd., London, GB; Class T, AN 83788468 & SU,A,983 655 (GIMEI).

*Primary Examiner*—Emanuel T. Voeltz
*Assistant Examiner*—Tony M. Cole
*Attorney, Agent, or Firm*—Kenyon & Kenyon

[57]  ABSTRACT

Switching devices in which current contacts are made by actuating a magnetic armature, are tested by analyzing the vibrations or sound emission occurring under operating conditions. According to the present invention, the sound emitted by the switching device when it is actuated is detected by a sensor and is transmitted to an evaluation device for discriminating the time and/or frequency curve of individual sound components. With the process of the present invention, discriminating between the sound signals produced by the making of the contacts on the one hand, and the striking of the armature on the other hand, is possible. In addition, a sound analysis in a suitable time range permits any faults present in the switching device to be classified. Finally, especially in the application to flashing signal relays, whether the sound of the relay is proper, can be objectively determined. In all cases, particularly the high frequency sound components are evaluated.

24 Claims, 6 Drawing Sheets

20ms

20ms

TESTING PROCESS FOR THE QUALITY CONTROL OF ELECTROMAGNETICALLY ACTUATED SWITCHING DEVICES

BACKGROUND OF THE INVENTION

The present invention relates to a testing process for the quality control of electromagnetically actuated switching devices in which current contacts are made by actuating a magnetic armature. The testing includes a step of analyzing the vibrations or sound emissions from the switching devices occurring under operating conditions.

Carrying out functional testing and quality control of switching devices by means of an oscillation analysis during switching has already been proposed. The Japanese Patent Publication No. JP-A-01/80876 (hereinafter "the '876 publication") discusses a process for determining the contact force of a switching device. In the process of the '876 publication, vibration signals generated upon contact closure and armature closure are evaluated. Furthermore, a process of the type described at the beginning is discussed in the Russian Patent Publication No. SU-A-983 655 (hereinafter, "the '655 publication"). In the process of the '655 publication, the magnetic armature is operated with different currents in two different test cycles. The sound signals generated during this process are detected by means of an acoustic sensor and the quality of the switching device is derived therefrom. Finally, the Russian Patent Publication No. SU-A-1 272 374 (hereinafter, "the '374 publication") discusses an arrangement for the quality control of encapsulated reed contacts. In the process described in the '374 publication, the coil for the electromagnetically actuated contacts is excited and the oscillations generated by actuating the relay in the open and in the closed condition of the relay are detected and evaluated.

In addition, the Russian Patent Publication No. SU-A-907-623 (hereinafter "the '623 publication") discusses a process of the type mentioned above, in which oscillation and sound spectra are examined as a whole. Specific criteria for predicting future failure rates of a switching device are derived from the oscillations by means of statistical methods.

The object of the present invention is to improve the known testing processes by making the quality control objective. The process should be applicable to different electromagnetically actuated switching devices. Moreover, if any faults are present, the process should be able to classify them. Furthermore, the process should be able to evaluate noises in relays, in particular, motor vehicle flashing signal relays.

SUMMARY OF THE PRESENT INVENTION

The present invention achieves the above mentioned objects by detecting the sounds emitted by the switching device when it is actuated. The emitted sounds are caused by the making of the contact and by the striking of the armature. The emitted sounds are detected by means of a sensor, are separated, and are transmitted to an evaluation device. The evaluation devices discriminates the time and/or frequency curve of individual sound components. In a preferred embodiment, only the sound produced by the armature strike is evaluated. This is especially true for an application using relays as the switching devices, in which the electromagnetically actuated armature must strike the magnetic core for the purposes of closing the contacts. Thus, any contact bounce occurring, for example, can be discriminated in a simple way.

In another application of the present invention, characteristic faults of alternating voltage-actuated switching devices (such as humming or chatter) are recognized. Specifically, the sound for recognizing the fault is analyzed within a time interval in which, in good parts, the magnetic armature is at rest and no sound should occur. Any sound signals occurring are used to classify the faults. In this way, humming or chatter of the switching devices, operated with alternating current, can be recognized.

Finally, in a further application, the present invention is used to assess the sound of motor vehicle relays to determine whether it is "proper". Until now, such assessments have been carried out subjectively, by listening. To achieve this object, sound signals generated when the contacts are made and/or when the armature strikes, are separated from the sound occurring after the actual switching noise, which is caused by component post oscillation. The separated sounds are used for objectively determining whether the sound of a relay, such as a motor vehicle flashing relay, is "proper".

In the present invention, on the one hand, airborne sound and/or high-frequency sound emission can be detected by means of a sensor which does not contact the switching device. On the other hand, the structure-borne sound and/or the high-frequency sound emission can be detected by means of a sensor contacting the switching device. The sound signals can, in this case, be evaluated in the evaluation device in an analog fashion or in a digital fashion.

Using the present invention in an application for testing relays as such switching devices, in which the electromagnetically actuated armature must strike the magnetic core for closing the contacts, the sound signals caused on the one hand by the contacting, and on the other hand, by the striking of the armature, are detected separately. These signals are discriminated from each other and only the sound signal produced by the striking of the armature is evaluated. In a similar way, any contact bounce occurring can be discriminated.

In all the described applications, frequencies in the ultrasonic range, and in particular, between about 50 kHz and 500 kHz, are advantageously evaluated. This allows an exact resolution with time and a better separation of the various sound sources than the frequencies below 20 kHz, that is, in the audible sound range. This represents a significant difference from the prior art.

Further details and advantages of the present invention will be apparent from the following description of figures of exemplary embodiments.

DETAILED DESCRIPTION

In an integrated production of contactors and/or relays, testing stations are necessary for checking individual components and functional properties. Within one testing station, the airborne sound emitted by the specimen, realized by means of the switching device and which results from an actuation of the contacts and/or the magnetic armature, is detected by means of a microphone.

Instead of the microphone, other sensors such as acceleration and/or sound emission pick-ups can also be used. Such sensors deliver a high-frequency alternating voltage. In a preferred embodiment, an envelope curve serving as a modified sound signal is derived from the high-frequency alternating voltage signal of the sensor. A measured envelope curve is designated with 1 in FIG. 1. From the envelope curve 1, the instant in which the magnetic armature of the switching device strikes is to be detected. In contrast, the instant of the contacting can be determined electrically, for example, preferably in the case of contact closure by switching of the main contact loop.

Especially for a digital signal evaluation, the following procedure is adopted. Upon applying the coil voltage, data acquisition is triggered and the instant of contact closure is subsequently detected, as mentioned above. From the already modified and digitized sound signals, a time series is calculated based on the following relationship:

$$y(t) = Max(abs(x(t)), (y(t-1)-d))$$

where x(t): sample value at time t abs(x(t)): absolute value of x(t)

x(t−1): previous sample value y(t): sample value of the modified time series d: decay constant.

Figure 1:
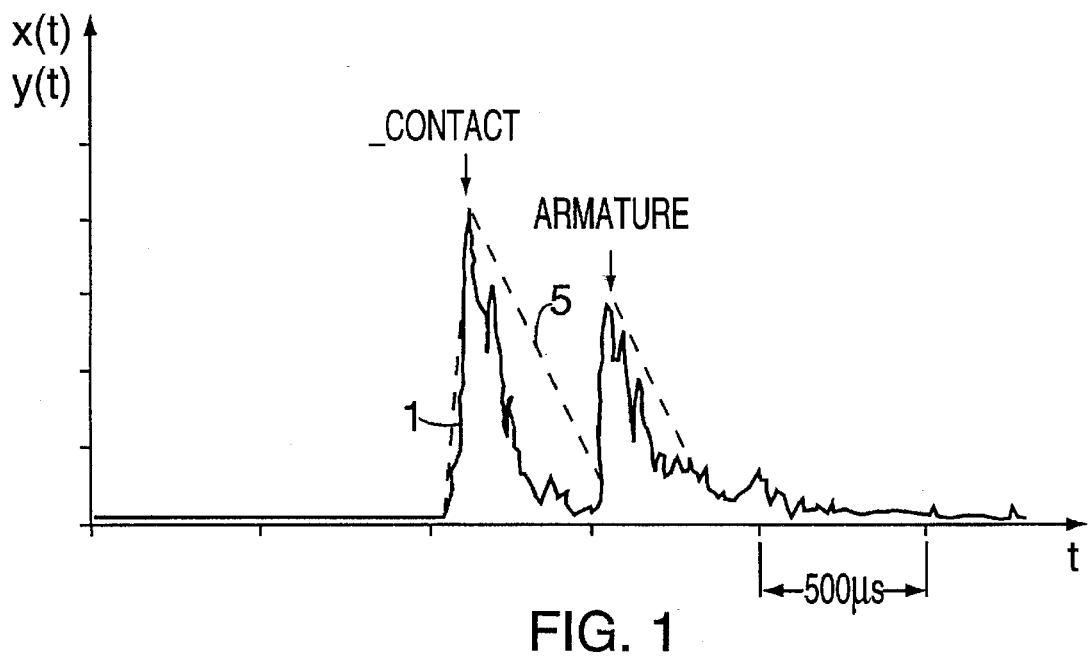
FIG. 1 is a graph which shows signals corresponding to sounds emitted during the closing of a magnetically actuated switching device.

According to this definition, x(t) therefore reproduces the envelope curve 1 of the sound emission signals in FIG. 1, while y(t) represents the modified signal which is designated with 5 in FIG. 1. The decay constant d is specific to the switching device. By calculating the instant at which y(t) is a maximum, which is yielded from the maximum of the absolute value of the sample values, the instant of the striking of the magnetic armature can then be determined. Now the computer must only test whether this calculated instant lies in a permissible time interval. From these steps, a statement about the quality of the switching device is derived.

Figure 2:
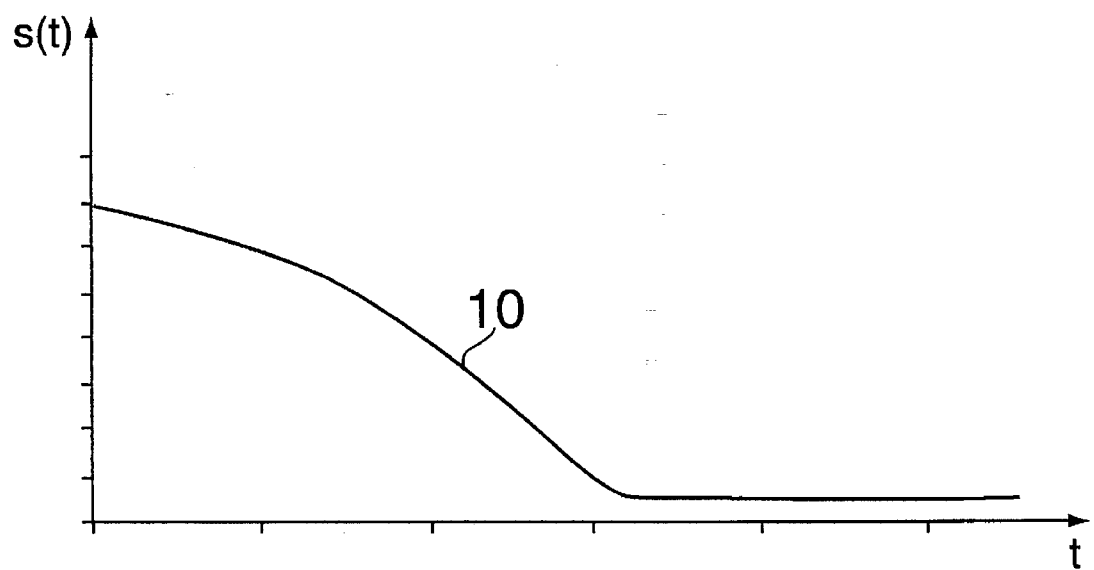
FIG. 2 is a graph which shows the armature travel occurring during the closing of the magnetically actuated switching device in FIG. 1.

In FIG. 2, the armature travel s(t) is designated by 10. A comparison of FIG. 1 and FIG. 2 confirms that the instant detected according to the above steps, is the instant that the armature strikes the magnetic core.

Alternatively to the above-described signal evaluation, the individual steps can also be realized with an analog signal evaluation in a procedure which is the same in principle. In this case, after triggering the data acquisition and determining the instant of the contact closure, an envelope curve is likewise generated from the sound signal. In this case, the instant that the armature strikes the magnetic core can be detected, for example, from the time derivative of the envelope curve. Specifically, the turning point of the rising envelope curve of the sound signal reaches a maximum when the time derivative of the envelope curve is 0. The armature strikes the magnetic core at this instant. This instant is tested once more with respect to a permissible time window of the switching device being examined.

Figure 3:
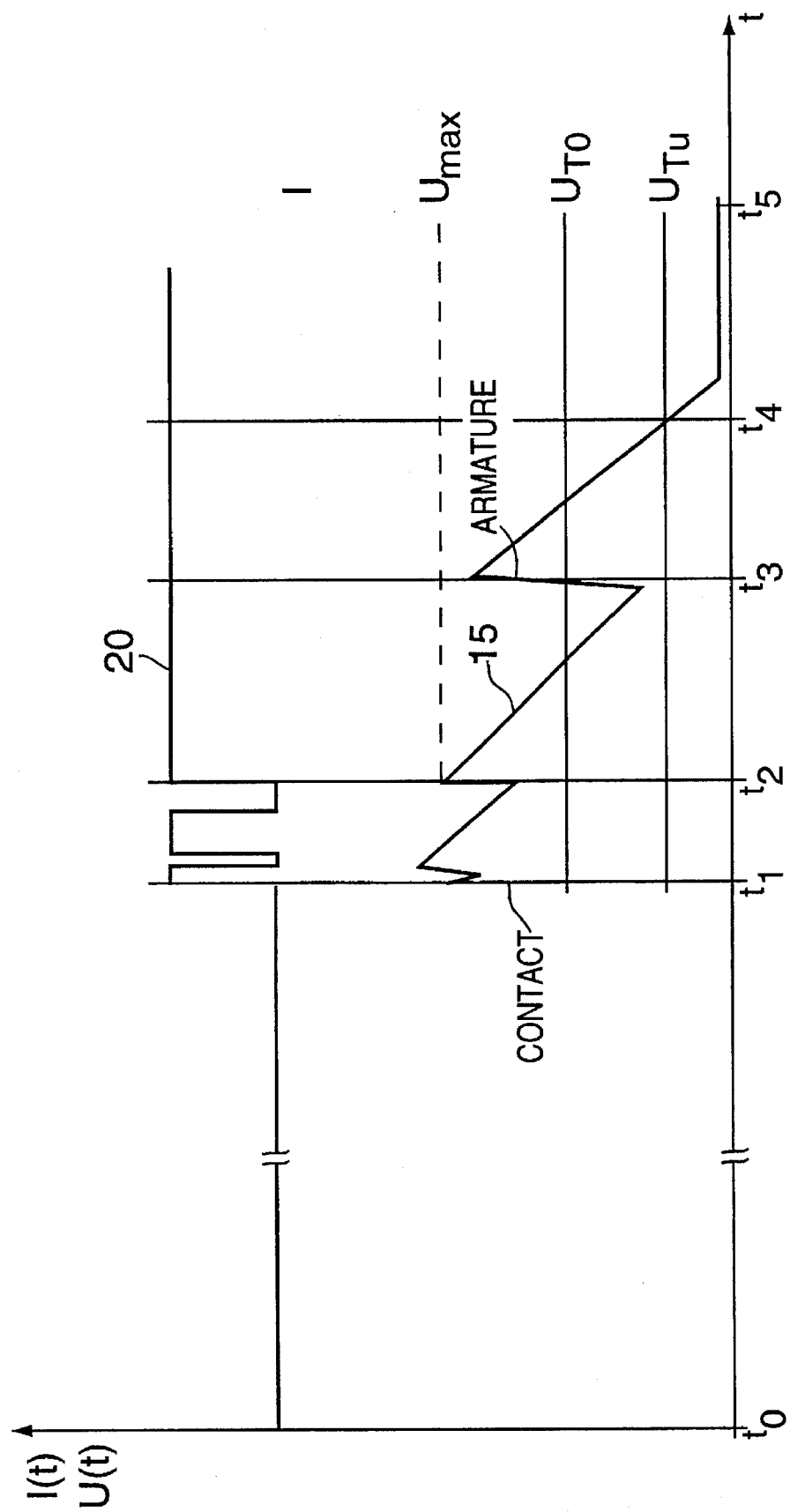
FIG. 3 is a timing diagram which shows a representation corresponding to FIG. 1 with signal evaluation for contact bounce and armature strike.

In FIG. 3, a modified envelope curve for the sound occurring in switching is designated by 15 and the contact current occurring in switching is designated by 20. Significant points in time are entered on the ordinate. Time t0 identifies the beginning of the measurement, which is characterized by applying the coil voltage. Time t1 to t2 identifies the contact closure. Time t3 to t4 identifies the armature strike and time t5 identifies the end of the measurement. Umax identifies the maximum value after $t_2$. $U_{To}$ and $U_{Tu}$ identify trigger thresholds.

In the example according to FIG. 3, a contact bounce occurs upon contact closure. Contact bounce can be discriminated by suitably evaluating the armature strike. For discriminating the contact bounce, the signal is acquired from t0 to t5, triggered by the coil voltage. The times t1 and t2 can be determined from the contact current graph 20. Subsequent to determining t2, Umax is determined. Trigger thresholds $U_{To}$ and $U_{Tu}$ are determined as a function of Umax. Times t3 and t4 can then be determined from the modified signal 15. By determining local maximum values and local minimum values of the modified envelope curve 15, the instants t1 for the contact closure, t2–t1 for the contact bounce, t4–t3 as condition for the armature strike and t3–t1 as instant for the armature strike, can be determined. The calculation can likewise be carried out with digital methods using the first-mentioned example.

Long-term tests have shown that the signal evaluation according to FIG. 1 and according to FIG. 3 delivers consistent results. The described process can be used for a so-called "100% testing" within the framework of an integrated production.

Figure 4:
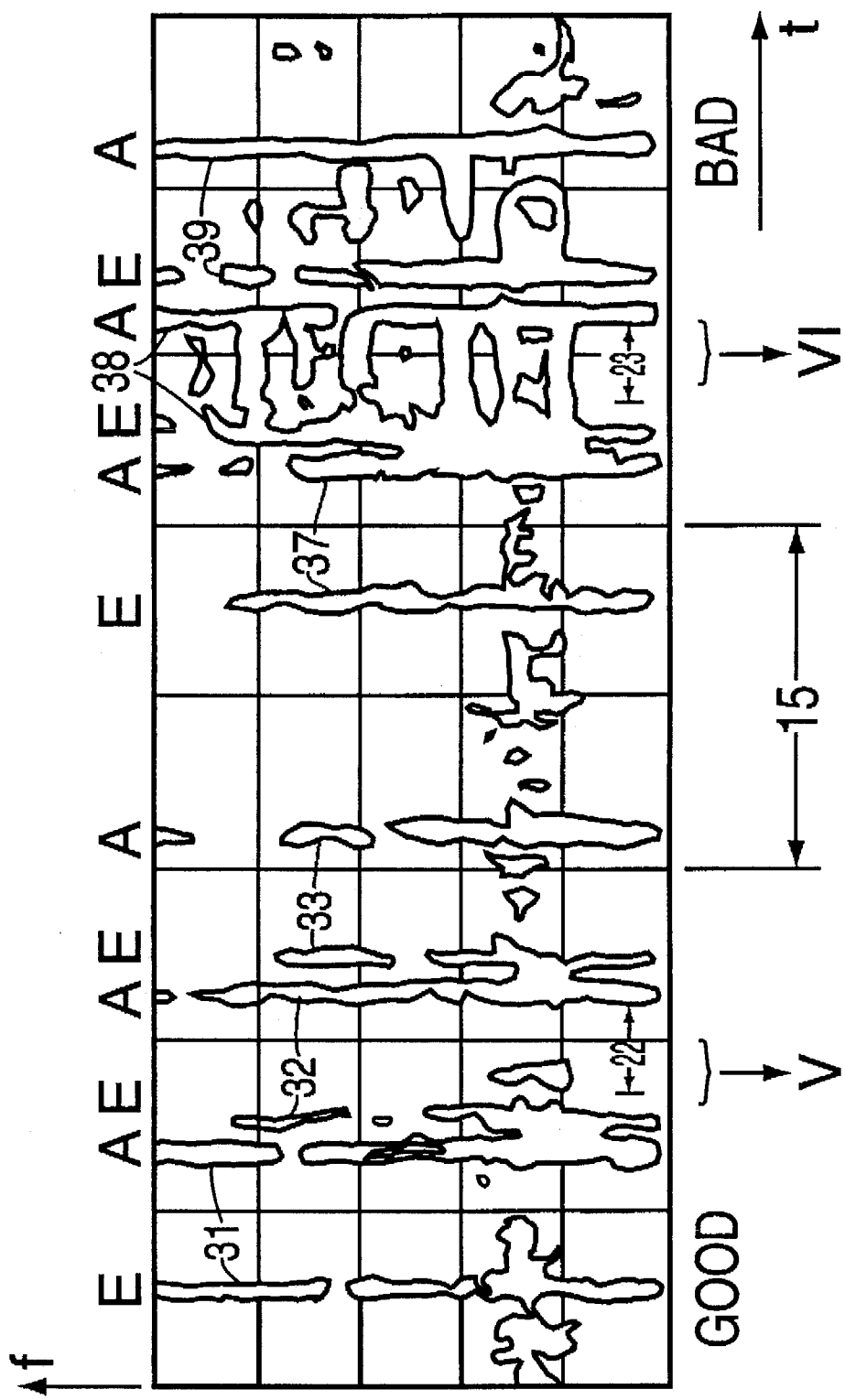
FIG. 4 shows a sonagram for alternating current-actuated contactors of good quality and of poor quality.
Figure 5:
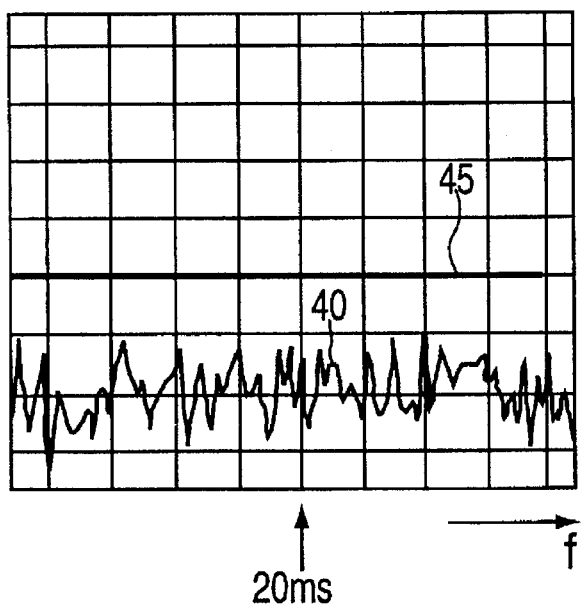
FIG. 5 shows the Cepstrum function derived from the first part of FIG. 4 for a contactor of good quality.
Figure 6:
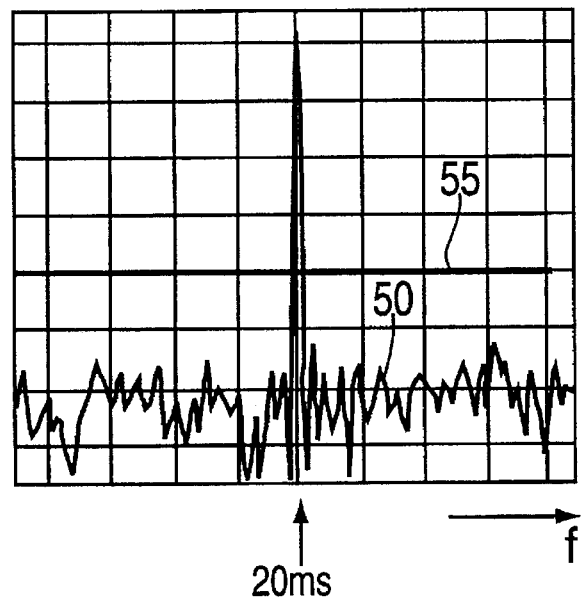
FIG. 6 shows the Cepstrum function derived from the second part of FIG. 4 for a contactor of poor quality.

The process according to FIGS. 4 to 6 is used for classifying faults in electromagnetically actuated switching devices. For this classification, the signals detected via a sound sensor during switching are digitized (for evaluation in a computer (PC)) by means of an A/D convertor and are temporarily stored. In the computer, the signal section in which, in "good specimens", the armature has already come to rest and, as a result, no sound is radiated, is evaluated.

The sonagram representation according to FIG. 4 contains the FFT-spectra (fast fourier transformation) as a function of the time, in each case for individual switch actuations. Three switching processes 31 to 33 are shown for a contactor of good quality and three switching processes 37 to 39 are shown for a contactor of poor quality. In each case, the switch-on process is designated by E and the switch-off process is designated by A.

In the sonagram representation, the intensity of the sound occurring at the different fourier frequencies is generally represented by different colors, which can be presented as amplitudes perpendicular to the paper surface. However, the different fourier frequencies are not important when evaluating the switch according to the process illustrated in FIGS. 4 to 6. Rather, in a switching interval of about half a second, in good parts, it is important that no more sound occurs after approximately 200 ms. At this point, the time intervals 22 and 23 of FIG. 4 are specifically evaluated, the evaluation regions according to FIGS. 5 and 6 having, in each case, a period duration of 20 ms.

If, in a time interval in which no signal spectrum is present in good parts, signals nevertheless occur, these signals can be attributed either to so-called "humming", in which a periodic spectrum is present, or to so-called "chatter", in which a non-periodic spectrum is present. Both humming and chatter are typical faults in electromagnetically actuated switching devices. Using a digital signal evaluation, these faults can be recognized in a simple way.

For recognizing humming, the cepstrum function is formed from the time series of the digitized sound signal. The cepstrum function is obtained from the inverse fourier transform of the logarithm of the power spectrum. The count value which lies at the period duration of the main frequency is a measure of the intensity of the hum. The cepstrum function is specified with 40 and 50 in FIGS. 5 and 6, respectively. In good parts corresponding to FIG. 5 (interval 22 of FIG. 4), the cepstrum function 40 lies in the scatter of the respective neighboring values. In humming contactors, on the other hand, the cepstrum function 50 according to FIG. 6 (interval 23 of FIG. 4) is distinctly above the scatter of the neighboring values. By comparing the maximum values of curves 40 and 50 with a prescribed limiting value, for example the thresholds 45 and 55 in FIG. 5 and FIG. 6, respectively, whether a faulty contactor has a humming characteristic can be determined.

The so-called chatter cannot be discriminated with the last evaluation. Chattering is caused by the multiple striking of the armature on the magnetic core and it is manifested as a severe increase of the signal amplitude, for example by 10 times. Thus, chattering can already be determined merely by calculating the effective value of the signal amplitude with a subsequent limiting value comparison.

Therefore, while the chattering of the magnetic armature during the functional testing of contactors or relays actuated with alternating voltage is manifested as a fault by the high sound intensity, the sound intensity can be small in the case of humming of the magnetic armature. Accordingly, humming cannot easily be recognized with conventional methods. Here, the cepstrum analysis, which has previously been used for speech analysis, inaugurates an improved fault discrimination.

The evaluation process described using FIGS. 4 to 6 is executed with a PC normally already available in the testing station. The evaluation process of the present invention can therefore be used without further expenditure within a normal assembly line and is insensitive to extraneous noise. Testing can be carried out at the speed of the production line because further mechanical or electrical testings can be carried out simultaneously. Long-term tests have shown that the signal evaluations according to FIGS. 4 to 6 deliver consistent results.

Figure 7:
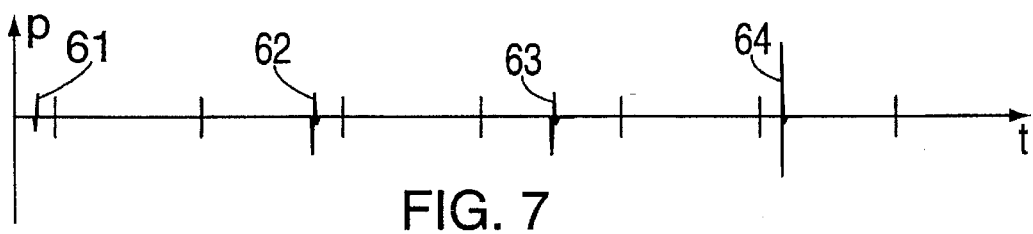
FIG. 7 shows a sound signal as function of the time, especially for the switching of flashing signal relays.
Figure 8:
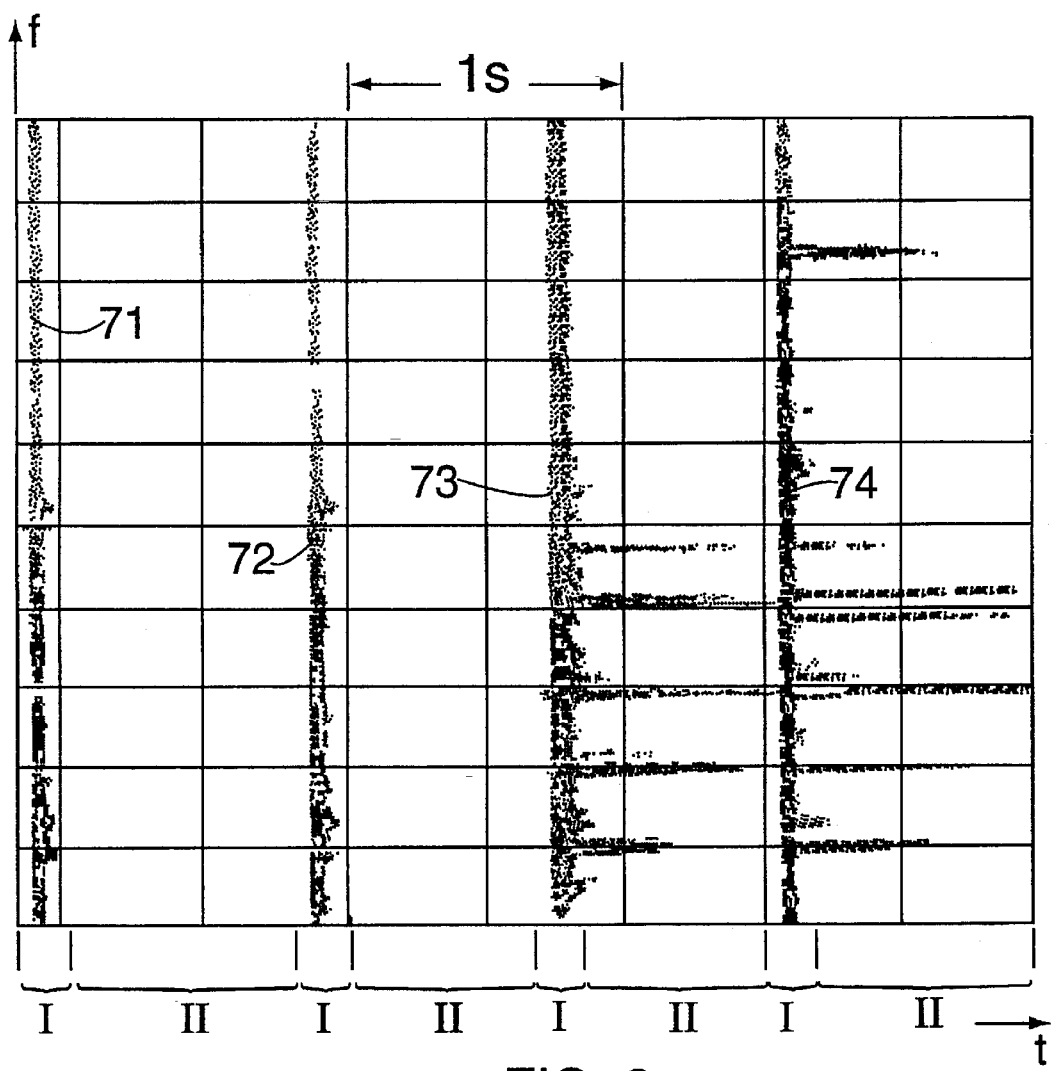
FIG. 8 shows a sonagram for the flashing signal relays switched in FIG. 7.
Figure 9:
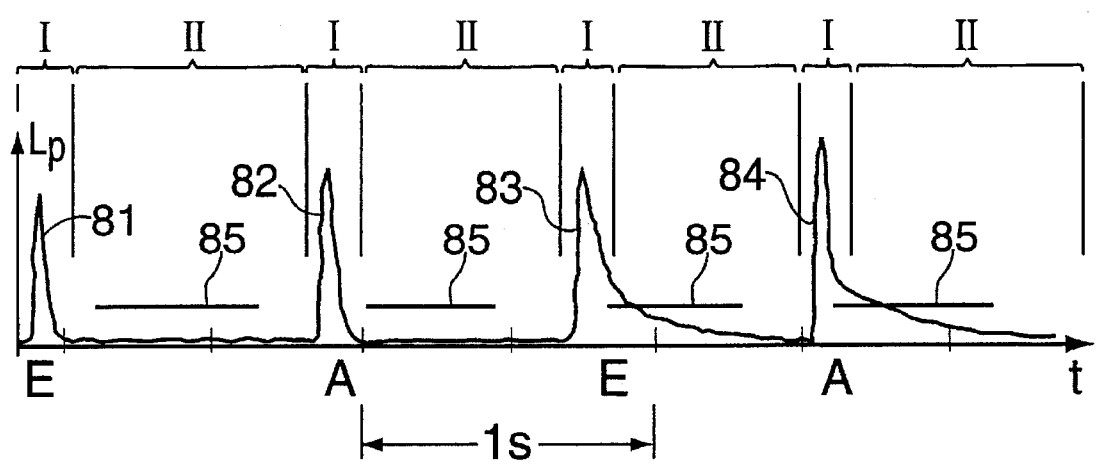
FIG. 9 shows the sound levels derived from FIG. 8.

FIGS. 7 to 9 show a process for objectively determining whether switches, especially motor vehicle flashing signal relays, have a "proper" sound. Such flashing signal relays are intended to sound "agreeable", that is, they are intended to generate a "dry" or "full" sound as the so-called proper sound. Further, such flashing signal relays preferably do not post-oscillate when switching. The problem of assessing whether flashing relay signals have the "proper" sound was, especially until now, solved purely subjectively, by listening. Standardized acoustic measuring processes, which proceed from an average value formation and, for example, carry out a frequency analysis, are not suitable for such an assessment.

In a digital evaluation by means of a computer, the digitized sound signal can preferably be stored in a computer. In so doing, a first time section, in which the striking noise lies, and a second time section, in which the striking noise has already decayed, are preferably defined from the stored values and both time sections are separately evaluated. Specific features, for example band-limited levels, can now be calculated and classified with respect to prescribed criteria for each of the two time sections. For this, it is also possible to use self-learning classifiers, such as neural networks for example.

In the case of a relay, the principle of the method proposed includes steps of separating those time components of the switching noise which are generated on the one hand, from the contacting and on the other hand, from the striking of the armature, from those components whose causes are the post-oscillation of other components of the relay. The latter post-oscillation can be caused, for example, by a return spring.

As an example, FIG. 7 shows the switch-on and switch-off noise of a "good" relay and a "poor" relay. In this case, as shown in FIG. 9, the switch-on process is designated by E in each case and the switch-off process is designated by A. The sound signals are respectively designated in detail by 61 to 64. Although the sound signals can have a quite different structure as a function of the time, stating the type of sound of the relay only therefrom, preferably in the case of a flashing signal relay, is not possible.

In FIG. 8 the sonagram representation for the individual relay actuations according to FIG. 7 contains FFT-spectra (fast fourier transformation) at different times. The two first sonagram representations 71 and 72 correspond to the sound signals 61 and 62 of FIG. 7 and the two sonagram representations 73 and 74 correspond to the sound signals 63 and 64 of FIG. 7.

As mentioned above, in the sonagram representation, the intensity of the sound occurring at the different fourier frequencies is generally indicated by means of different colors which can also be represented as amplitudes perpendicular to the plane of the paper. However, in the evaluation of the example according to FIGS. 7 to 9, the amplitudes of the different fourier frequencies are not important. Rather, in the case of good-sounding relays, it is important in the present case that sound intensity occurs in a narrowly limited interval I as a first time section. On the other hand, in the case of bad sounding relays, sound intensities also occur in an interval II after the first time interval I. In interval II, defined as the second time section, sound intensities frequently occur at discrete frequencies of the spectrum and represent, in particular, the reverberation at the end of the ringing noise. Considered abstractly, the switching processes are indicated by, in the selected quasi-three-dimensional representation of the sonagram according to FIG. 8, vertical bars, the reverberation sounds, on the other hand, are indicated by horizontal bars. Accordingly, the reverberation sounds can be discriminated in a simple way.

For technical implementation, an evaluation of the representation according to FIG. 8 can be realized in a computer by (after detecting the sound signals with a suitable sensor, such as a microphone or an acceleration pick-up) digitizing the sound signals by means of an A/D converter and by temporarily storing the digital data. In the stored data the first time section I, in which the striking noise lies, and the second time section II, in which the striking noise has already decayed, can now be defined. For each of the two time sections, features, such as band-limited levels for example, are calculated. By classifying the features by means of empirically obtained values, the sound can be evaluated and whether the relay has the proper sound can be objectively determined.

A self-learning classifier can be used to classify the features. The self-learning classifier can use neural networks for example. The classifier can adjust itself in a training phase in which, apart from the detected features, a subjective classification of the tester can also be entered. In the subsequent testing phase, the assessment of the tester can thus be reproducibly implemented.

As an alternative to using a self-learning classifier, a set of features using a formula can also be depicted on a notation scale and form a basis for assessing the relays.

In FIG. 9, according to a simplified evaluation method, the sound level is represented in the individual time sections. In this case, a sound level 81 to 84, approximately equal in terms of magnitude, occur, in each case in an unequivocal way, in the first timed sections I. In the second time sections II, in the case of good relays, the sound levels 81 and 82 have a value which goes to approximately zero and, in the case of poor relays, the sound levels 83 and 84 decay more slowly. The values of the decay flanks can be measured by means of suitable threshold detection means. For example, whether a relay is good or poor can be determined from a threshold 85.

In all cases, an objective testing system is realized which allows an improved determination of the sound of relays, preferably the so-called "proper" sound. Using the evaluation process according to FIGS. 7 to 9, the sampling of new variants of the relays is simplified and the quality testing of the relays is thus extended. The process can be used advantageously for assessing motor vehicle flashing signal relays. An objective measuring process is thus provided which simplifies acceptance negotiations during the delivery of the relays by motor vehicle suppliers.

What is claimed is:

1. A testing process for the quality control of electromagnetically actuated switching devices in which current contacts are made by actuating an armature, the process including steps of:
   a) actuating the armature of a switching device to close the switching device;
   b) detecting sound emitted by the switching device when its armature is actuated;
   c) transmitting the sound detected in step (b) to an evaluation device;
   d) discriminating sound signals caused by a making of the contact from sound signals caused by the armature striking a magnetic core by analyzing at least one of a time curve of individual components of the sound and a frequency curve of the individual components of the sound;
   e) evaluating only the sound signals caused by the armature striking the magnetic core.

2. The method of claim 1 wherein the step of actuating the switching device closes a main current loop, further comprising a step of:
   f) detecting an instant of the making of the contact based on a time when the main current loop is closed.

3. The process of claim 2 further comprising a steps of:
   g) digitally sampling the sound signals after the instant of the making of the contact;
   h) calculating a modified signal sample y(t) from the sound signals digitally sampled in step (g) according to the following relationship:

$$y(t)=Maximum(Abs(x(t)),(y(t-1)-d)),$$

wherein x(t) is a digitally sampled sound signal at time t, x(t−1) is a digitally sampled sound signal immediately preceding sample x(t), abs(x(t)) is an absolute value of x(t), and d is a decay constant;
   i) determining an instant at which the armature contacts the magnetic core to be the instant of the maximum value of y(t); and
   j) determining whether the instant at which the armature contacts the magnetic core determined in step (i) falls within a predetermined permissible time window for the switching device.

4. The process of claim 2 wherein the step of detecting begins when a coil voltage is applied to the magnetic armature.

5. The process of claim 1 further comprising steps of:
   f) generating an envelope curve from the sound signal;
   g) determining a time derivative of the envelope curve;
   h) detecting an instant at which the armature strikes a magnetic core to be the time derivative determined in step (g);
   i) determining whether the instant at which the armature strikes the magnetic core determined in step (h) falls within a predetermined permissible time window for the switching device.

6. The process of claim 1 wherein the step of detecting includes a sub-step of detecting at least one of airborne sounds and high frequency sounds by means of a sensor which is separated from the switching device.

7. The process of claim 1 wherein the step of detecting includes a sub-step of detecting at least one of structure-borne sounds and high frequency sounds by means of a sensor which physically contacts the switching device.

8. A testing process for quality control of an electromagnetically actuated switched device in which current contacts are made when an armature is actuated and in which, when properly functioning, the armature comes to rest during a time range, the process comprising steps of:
   a) actuating the armature to close the switching device;
   b) detecting a sound emitted by the switching device when the armature is actuated;
   c) transmitting the sound detected in step (b) to an evaluation device;
   d) discriminating individual components of the sound detected in step (b) based on at least one of a time curve of the individual components of the sound and frequency curve of the individual components of the sound;
   e) analyzing the sound transmitted in step (c) in the time range; and
   f) classifying the analyzed sound detected within the time range as at least one of a plurality of faults.

9. The process of claim 8 wherein the switching device is a relay operated with an alternating current.

10. The process of claim 8 wherein the step of analyzing in step (e) further includes sub-steps of:
    i) calculating a cepstrum function from the sound; and
    ii) determining whether a humming exists in the switching device based on the cepstrum function calculated in step (e)(i).

11. The process of claim 8 wherein the step of analyzing in step (e) further includes sub-steps of:
    i) calculating an effective value of a signal amplitude from the sound; and
    ii) determining whether a chattering exists in the switching device based on the effective value calculated in step (e)(i).

12. The process of claim 8 wherein the step of detecting includes a sub-step of detecting at least one of airborne sounds and high frequency sounds by means of a sensor which is separated from the switching device.

13. The process of claim 8 wherein the step of detecting begins when a coil voltage is applied to the magnetic armature.

14. The process of claim 8 wherein the step of classifying faults based on the sound analyzed in step (e) is performed by a self-learning classifier.

15. The process of claim 14 wherein the self-learning classifier includes a neural network.

16. The process of claim 8 wherein the step of detecting includes a sub-step of detecting at least one of structure-borne sounds and high frequency sounds by means of a sensor which physically contacts the switching device.

17. A testing process for the quality control of electromagnetically actuated switching devices in which current contacts are made by actuating an armature, the process comprising steps of:
   a) actuating the armature to close the switching device;
   b) detecting sound emitted by the switching device when the armature is actuated;
   c) transmitting the sound detected in step (b) to an evaluation device;
   d) discriminating individual components of the sound based on at least one of a time curve of the individual components of the sound and frequency curve of the individual components of the sound;
   e) separating sound signals which are generated when the contact is made and generated when the armature strikes a magnetic core from sound signals caused by a post-switching oscillation of components; and
   f) objectively determining whether the switching device has a proper sound based on the separated sound signals.

18. The process of claim 17 wherein the switching device is a motor vehicle flashing signal relay.

19. The process of claim 17 further comprising steps of:
   digitizing the sound signal detected in step (b); and
   defining a first time section in which a noise caused by the armature striking the magnetic coil lies;
   defining a second time section in which the noise caused by the armature striking the magnetic coil has decayed; and
   separately evaluating the first and second time sections.

20. The process of claim 17 wherein the step of detecting includes a sub-step of detecting at least one of airborne sounds and high frequency sounds by means of a sensor which is separated from the switching device.

21. The process of claim 17 wherein the step of detecting includes a sub-step of detecting at least one of structure-borne sounds and high frequency sounds by means of a sensor which physically contacts the switching device.

22. The process of claim 17 wherein the step of detecting begins when a coil voltage is applied to the magnetic armature.

23. The process of claim of claim 17 wherein the step of objectively determining whether the switching device has a proper sound uses a self-learning classifier.

24. The process of claim 23 wherein the self-learning classifier includes a neural network.

* * * * *